United States Patent

Suwabe et al.

[11] Patent Number: 5,993,616
[45] Date of Patent: Nov. 30, 1999

[54] METHOD FOR PRODUCING A MAGNETO-OPTICAL RECORDING MEDIUM

[75] Inventors: Masatsugu Suwabe; Yoshihito Fukushima; Yoshihiro Muto, all of Miyagi, Japan

[73] Assignee: Sony Corporation, Tokyo, Japan

[21] Appl. No.: 08/961,157

[22] Filed: Oct. 30, 1997

[30] Foreign Application Priority Data

Oct. 31, 1996 [JP] Japan .............................. P08-290559

[51] Int. Cl.$^6$ .......................... C23C 14/32; C23C 16/00
[52] U.S. Cl. ................ 204/192.15; 204/192.12; 204/192.2; 427/250; 427/255.7; 427/255.2
[58] Field of Search .......................... 204/192.15, 192.2, 204/192.12; 428/694, 693, 336, 694 MM, 694 ML; 427/470, 479, 569, 576, 131, 132, 250, 255.2, 255.7, 404

[56] References Cited

U.S. PATENT DOCUMENTS

| | | | |
|---|---|---|---|
| 4,952,295 | 8/1990 | Kawabata et al. | 204/192.15 |
| 5,427,671 | 6/1995 | Ahmed | 204/298.23 |
| 5,536,570 | 7/1996 | Osato | 428/336 |
| 5,772,856 | 6/1998 | Kawase et al. | 204/192.2 |

Primary Examiner—Roland Martin
Assistant Examiner—Gregg Cantelmo
Attorney, Agent, or Firm—Hill & Simpson

[57] ABSTRACT

This invention provides a method for producing a magneto-optical recording medium with a laminated film composed of a plurality of magnetic layers made of alloys of rare earth metals-transition metals such as a magneto-optical recording medium allowing direct overwriting through light intensity modulation and a magneto-optical recording medium allowing magnetically induced recording with super resolution, or a method for stably producing a magneto-optical recording medium excellent in performance.

The method consists of using, as vaporizers to form the laminated magnetic film, three or more vaporizers including one or more vaporizers containing mainly rare earth elements and one or more vaporizers containing mainly transition metals. Then, particles ejected from a vaporizer containing mainly a rare earth metal and from two or more vaporizers containing mainly transition metals are allowed to continue to impinge onto the surface upon which the laminated film is to be formed, throughout the formation of the laminated film.

8 Claims, 2 Drawing Sheets

METHOD FOR PRODUCING A MAGNETO-OPTICAL RECORDING MEDIUM

BACKGROUND OF THE INVENTION

This invention relates to a method for producing a magneto-optical recording medium which, like a magneto-optical disk allowing overwriting through light intensity modulation, has a laminated structure composed of a plurality of magnetic layers made of alloys of rare earth metals-transition metals.

Recently, in the field of magneto-optical recording, demands for higher functions such as high rate of data transmission and high density of recorded data are increasingly growing. To meet such demands, various techniques have been put into practice. For example, a representative technique enabling such high rate of data transmission includes overwriting through light intensity modulation, and another technique enabling such high density of data recording includes magnetically induced recording with super resolution (MSR).

These techniques can be put into effect when a laminated magnetic film is realized, instead of a conventional magneto-optical disk composed of a single magnetic layer, which includes a plurality of magnetic layers made of alloys of rare earth metals-transition metals alternately place one over another.

Such laminated magnetic film is usually produced with a sputtering apparatus which contains a plurality of shooters in a single filming chamber. During operation, materials different in composite elements are charged into individual shooters, and a substrate is placed opposite to those shooters one after another. Particles shot from individual shooters are deposited one over another on the substrate, to form a magnetic disk with a laminated structure having a plurality of layers of different compositions.

For a laminated film to be made by sputtering as described above, conventionally, a plurality of substrates are mounted onto a circular plate, and the plate is rotated such that the substrates mounted thereupon are placed opposite to the shooters one after another, and that all the substrates develop films on their surface at the same time. The composition of a given magnetic layer is adjusted after the shutter placed in front of a shooter has been opened or closed, or after driving powers delivered to the shooter have been adjusted appropriately.

As described above, techniques such as direct overwriting through light intensity modulation or magnetically induced recording with super resolution can be put into effect only after they are applied to a laminated magnetic film with a plurality of layers made of alloys of rare earth metals-transition metals, and different in composition from one another. However, even if a magneto-optical recording medium with such laminated magnetic layers is actually produced, it will not always give the properties as have been theoretically expected stably.

To put it more specifically, even if a magneto-optical recording medium with such laminated structure is actually produced, the properties necessary for the expected high performance will be often present unevenly on the interfaces of laminated structure. Or, if a large number of magneto-optical recording media are produced, the properties in question of individual media will show a wide variation. These problems form the reason why conventional magneto-optical recording media with a laminated structure whose properties are sufficiently good to allow high grade recording have never been stably produced.

SUMMARY OF THE INVENTION

With above situation as a background, this invention has been proposed, and intends to provide a method for stably producing a magneto-optical recording medium with good recording properties which consists of producing a magneto-optical recording medium with a laminated magnetic film composed of a plurality of magnetic layers made of alloys of rare earth metals-transition metals.

A magneto-optical recording medium with a laminated structure allows direct overwriting through light modulation and MSR depending on the interactions between individual magnetic layers composing the laminated structure and the magnetic barrier energies σw determined by the electric anisotropy of those magnetic layers. Accordingly, it is very important to control, during the manufacture of a laminated film, the magnetic barrier energy σw. The magnetic barrier energy σw can be expressed by the following equation 1:

$$\sigma w = (AK)^{1/2}$$
$$K = Ku - 2\pi Ms^2 \qquad \text{[Equation 1]}$$

where A represents a constant describing interactive stiffness, K a constant describing an effective magnetic anisotropy, Ku a constant describing vertical magnetic anisotropy, and Ms the magnitude of magnetization.

This magnetic barrier energy σw of a given interface can vary greatly according to what state the boundary between the two adjacent magnetic layers takes. Assumed that a layer (a boundary layer) is formed at the boundary between two adjacent layers, and a greater part of the magnetic boundary is localized within this layer, the barrier energy σw will be determined by the following parameters inherent to the material constituting the boundary layer, such as integrative stiffness constant A, vertical magnetic anisotropy Ku and magnetization Ms. Namely, if it is assumed that a boundary layer is formed there, the interactive stiffness constant A, vertical magnetic anisotropy constant Ku and magnetization Ms of Equation 1 will determine the characteristics of that boundary layer.

Let's assume, for example, that between two magnetic layers is formed a boundary layer which is composed of a material whose interactive stiffness constant A is very small, such as a non-magnetic element or rare earth metal. Then, as is obvious from the inspection of Equation 1, the magnetic barrier energy σw will have a very small value. Let's take another example where formed is a boundary layer composed of a material whose magnetization Ms is very large, such as a transition metal like Fe or Co. In this example too, the magnetic barrier energy σw will have a very small value, as is seen from Equation 1.

The manner how such a boundary layer is formed will be described below in detail, taking as an example a case where a laminated magnetic film which includes a first magnetic layer composed of Gd (FeCo) and a second magnetic layer composed of Tb (FeCo) is prepared by sputtering.

The laminated magnetic film is produced with a sputtering machine which contains, in a single film-forming chamber, four shooters which will eject vapors of Tb, Gd, Fe and FeCo, or the materials of film. Each shooter has, in its front, a shutter which can be freely opened and closed. A substrate upon which a magnetic film with a laminated structure is to be formed is placed opposite to the shooters.

To form the first magnetic layer, three shooters to eject Gd, Fe and FeCo are allowed to eject respective particles to form a layer on the substrate. Thus, for the first magnetic layer to be formed, the shutters placed in front of Gd, Fe and FeCo shooters are opened, while the shutter placed in front of Tb shooter is kept closed so that particles from the Tb shooter may not reach the substrate. Through this operation, the first magnetic layer composed of Gd(FeCo) is formed on the substrate.

To form the second magnetic layer, only particles from three shooters containing Tb, Fe and FeCo are allowed to deposit on the substrate. Thus, for the second magnetic layer to be formed, the shutters placed in front of Tb, Fe and FeCo shooters are opened, while the shutter placed in front of Gd shooter is kept closed so that particles from the Gd shooter may not reach the substrate. Through this operation, the second magnetic layer composed of Tb(FeCo) is formed on the substrate When above operation is practiced with a conventional sputtering apparatus, shutters are controlled sequentially so that they may open and close in a specific order. Let's assume shutters in front of Gd, Tb, Fe and FeCo shooters are closed one after another in this order. Then, the operation of shutters will proceed as shown in Table 1. In this table, open circles represent opening of a shutter while crosses represent closure of a shutter. The intermediate state designates the state the sputtering apparatus takes on completion of the formation of the first magnetic layer and before the start of the second magnetic layer formation.

TABLE 1

|  | Shutter of Gd shooter | Shutter of Tb shooter | Shutter of Fe shooter | Shutter of FeCo shooter |
| --- | --- | --- | --- | --- |
| First magnetic layer being formed | ○ | X | ○ | ○ |
| Intermediate state | X | X | ○ | ○ |
| Second magnetic layer being formed | X | ○ | ○ | ○ |

As seen from Table 1, while the first magnetic layer is being formed, the shutter of Gd shooter is opened, that of Tb shooter is closed, that of Fe shooter is opened, and that of FeCo shooter is opened. On completion of the formation of first magnetic layer, the shutter of Gd shooter is closed, and later the shutter of Tb shooter is opened.

What is problematic when above method is employed for the formation of a magnetic film with a laminated structure is that an intermediate state intervenes at each interval between the formation of two subsequent magnetic layers. In the above example, when the sputtering apparatus is at the intermediate state, particles from the shooters to eject rare earth metals (Gd and Tb shooters) do not reach the substrate, and only particles from the shooters to eject transition metals (Fe and FeCo shooters) can reach the substrate. Accordingly, when this method is employed for the formation of a magnetic film with a laminated structure, at least parts of the boundary between the first and second magnetic layers will be necessarily composed only of transition metals.

In the above example, opening and closure of shutters are utilized to control the composition of magnetic layers constituting the magnetic film. However, the composition of layers constituting the magnetic film may be adjusted by controlling powers delivered to individual shooters. When powers delivered to individual shooters are adjusted, an intermediate state also intervenes at an interval between the formation of subsequent magnetic layers. Therefore, in this case too, at least parts of the boundary between the first and second magnetic layers will be necessarily composed only of transition metals.

As described above, a transition metal tends to magnetize rapidly, and thus has an ability to greatly reduce the magnetic barrier energy σw. Accordingly, even when such boundary layer is formed, the magnetic barrier energy σw generated close to the boundary layer will be greatly reduced. Namely, a film consisting of the first and second magnetic layers with such a boundary layer at the interface as described above will have a far smaller magnetic barrier energy σw than a film with a similar structure but with no such boundary layer at the interface. Therefore, the film having a laminated structure with such boundary later at the interface will not give such characteristics as are generally expected from a laminated magnetic film including first and second magnetic layers.

Further, as the boundary layer is formed in a very brief period between the formation of two subsequent magnetic layers, it is not always formed evenly at the interface, and usually formed on certain limited parts of the substrate. Furthermore, when a number of substrates are laminated at the same time, boundary layers are formed at those substrates but not in a similar manner. Thus, the formation of boundary layer is different from one substrate to another. As a result, for a given substrate, some parts contain a boundary layer while other parts do not, or, the boundary layer is different in its distribution from one magnetic layer to another. Owing to these defects, the laminated magnetic films produced by conventional methods are considerably variable in their characteristics.

The present inventors have strenuously studied to overcome these defects inherent to conventional techniques, and found that, when layers composed of alloys of rare earth metals-transition metals are placed one over another to produce a laminated magnetic film with a plurality of magnetic layers, the resulting film will have a boundary layer at each boundary between two adjacent magnetic layers, and these boundary layers will contribute to the stable production of a magneto-optical recording medium with excellent recording properties.

The method of this invention allows a substrate, during the formation of a laminated film thereupon, to be exposed to vapors ejected from two or more shooters including one containing mainly the vapor of a rare earth metal, and another containing mainly the vapor of a transition metal, thereby making it possible that the variation in the properties of individual laminated magnetic films is minimized. Therefore, the method of this invention ensures stable production of a magneto-optical recording medium with excellent recording properties. In addition, as the variation in the properties of individual laminated magnetic films can be minimized, more freedom will be permitted when a new recording medium is designed, and the yield of satisfactory products will be increased.

The method of this invention for producing a magneto-optical recording medium consists of producing a laminated magnetic film with a plurality of magnetic layers composed of alloys of rare earth metals-transition metals, by using three or more vaporizers including one or more vaporizers to eject mainly rare earth metals, and one or more vaporizers to eject mainly transition metals, and by shooting, from two or more vaporizers including those to eject mainly rare earth metals and those to eject mainly transition metals, metal particles on the surface of a substrate so that a laminated magnetic film may be formed thereupon.

The above method for producing a magneto-optical recording medium, in essence, consists of forming a boundary layer at least at one interface between magnetic layers constituting the laminated magnetic film. Further, this method for producing a magneto-optical recording medium is particularly suitable for the production of magneto-optical recording media allowing direct overwriting through light intensity modulation and MSR.

The above method of this invention for producing a magneto-optical recording medium consists, as described above, of shooting metal particles from two or more vaporizers including those to eject mainly rare earth metals and those to eject mainly transition metals onto the surface of a substrate to form a laminated film thereupon. Accordingly, when the method of this invention is employed, no boundary layers are formed that are composed only of transition metals or only of rare earth metals, and if a boundary layer is formed at all, it will be composed of both transition and rare earth metals.

For the laminated magnetic film with a plurality of magnetic layers composed of alloys of rare earth metals-transition metals, the magnetic barrier energy $\sigma w$ will undergo great variations if boundary layers are composed only of transition metals or rare earth metals, while the energy in question will remain considerably independent of the state of boundary layers if the boundary layers are composed of both transition and rare earth metals. Accordingly, according to the method of this invention, variations in the magnetic barrier energy $\sigma w$ due to the state of boundary layers can be suppressed effectively.

DESCRIPTION OF THE PREFERRED EMBODIMENTS

Now, as a concrete example of the product which is produced by the method of this invention, we will take a magneto-optical disk which allows direct overwriting through light intensity modulation without requiring initial magnetization from outside, and describe the method of this invention in detail below with reference to attached figures. It must be understood, however, that this invention is not limited to those examples, and that this invention can be modified into any desired forms without departing from the sprit and scope of this invention.

A magneto-optical disk which allows direct overwriting through light intensity modulation without requiring initial magnetization can be obtained after a laminated magnetic film with at least four magnetic layers has been prepared, as disclosed in Japanese Patent Laid-Open No 63-268103. To put it more specifically, such magneto-optical disk can be obtained after a disc substrate has been given four magnetic layers: one layer for memory which is magnetized appropriately according to signals to be recorded, a second layer for recording which is modified in magnetization direction briefly according to signals, a third layer for switching which is demagnetized briefly during signal recording, and the fourth layer for initialization which stays invariable in magnetization direction even during signal recording. To ensure stable operation and the spacious margin of finished film, however, it is desirable to insert a further magnetic layer called an intermediate layer between the memory and recording layers to appropriately adjust the magnetic link of those two layers which may take place through the interaction of the two layers.

Thus, we will take, as an example, a magneto-optical disk with a laminated film consisting of five magnetic layers which are designated as a memory layer, intermediate layer, recording layer, switching layer and initialization layer, and describe the method necessary for the production thereof. An actual magneto-optical disk has, in addition to above five layers, a dipole layer and a heat conductive layer to improve the optical and thermal properties as will be described later.

The construction of the magneto-optical disk of this preferred embodiment will be described with reference to FIG. 1.

Figure 1:
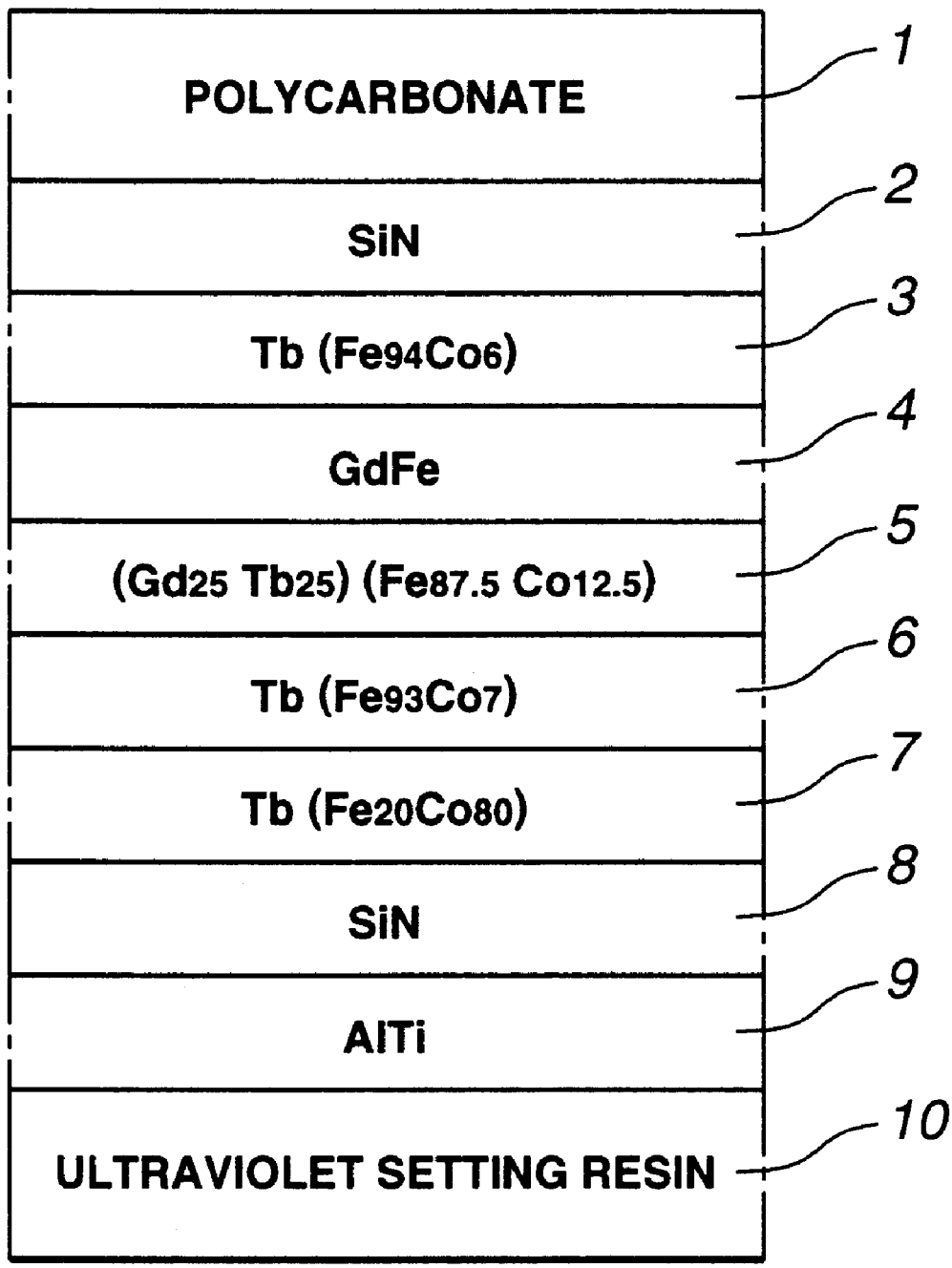
FIG. 1 gives a schematic perspective view of one example of the sputtering apparatus.

As shown in FIG. 1, this magneto-optical disk is produced after, on a disc substrate made of polycarbonate, have been formed a first dipole layer 2, memory layer 3, intermediate layer 4, recording layer 5, switching layer 6, initialization layer 7, second dipole layer 8, and heat conductive layer 9 in this order, and, in addition, a protective layer 10 made of a Ultraviolet setting resin has been overlaid on the heat conductive layer 9.

The first and second dipole layer are made of SiN, and the heat conductive layer 9 of AlTi. On the other hand, the memory layer 3, intermediate layer 4, recording layer 5, switching layer and initialization layer 9 are magnetic layers composed of amorphous alloys of rare earth metals-transition metals. A sputtering apparatus which includes a set of shooters for the ejection of Tb 21, Gd 22, Fe 23 and $Fe_{20}Co_{80}$ 24 in a chamber was prepared as shown in FIG. 2, and, being driven by a DC magnetron, it uses Ar as a sputtering gas to shoot metal vapors in succession without impairing vacuum in the chamber to form a laminated film on a substrate.

The compositions of individual magnetic layers were adjusted under the control of powers delivered to individual shooters 21, 22, 23 and 24. In addition, shutters not illustrated here were placed in front of those shooters 21, 22, 23 and 24, and the opening and closure of those shutters were used to control the ejection of metal particles from individual shooters. Briefly, in this embodiment, the compositions of individual magnetic layers were adjusted both through the opening and closure of shutters and through the control of outputs delivered to the shooters 21, 22, 23 and 24.

Figure 2:
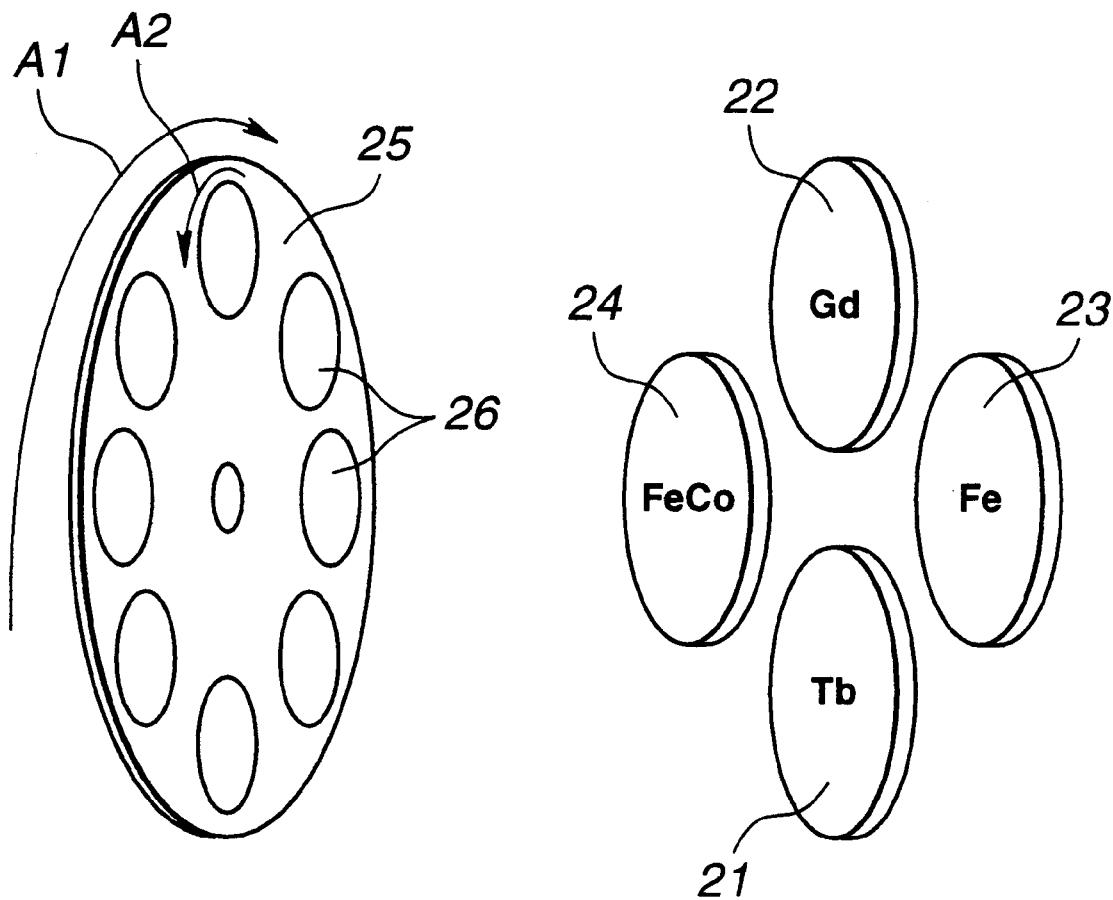
FIG. 2 shows the laminated structure of one example of a magneto-optical disk prepared by the method of this invention.

Further, to avoid the uneven formation of magnetic layers in composition and thickness during the manufacture of a laminated film, a board 25 made of a round metal plate was prepared as shown in FIG. 2. A plurality of disc substrates were placed on the board being held with substrate holders 26. The substrate revolves round the center of board 25 as shown by the arrow A1 in FIG. 2, while it rotates at the same time round the center of respective substrate holder 26 as shown by the arrow A2 in FIG. 2.

For the first dipole layer 2, memory layer 3, intermediate layer 4, recording layer 5, switching layer 6, initialization layer 7, second dipole layer 8 and heat conductive layer 9 constituting the magnetic film, the physical characteristics including composition, thickness, TM/RE, saturated magnetization, and curie temperature are listed in Table 2. TM/RE represents the ratio of the amount of transition metals against the amount of rare earth metals in a given magnetic layer. More specifically, the amount contributed by the Fe and $Fe_{20}Co_{80}$ shooters 23 and 24 in forming a layer is expressed relative to the amount contributed by the Tb and Gd shooters 21 and 22 in forming the same layer to give the ratio TM/RE.

TABLE 2

| | Composition | Thickness [nm] |
|---|---|---|
| First dipole layer | SiN | 65 |
| Memory layer | $Tb(Fe_{94}CO_6)$ | 30 |
| Intermediate layer | GdFe | 10 |
| Recording layer | $(Gd_{25}Tb_{75})(Fe_{87.5}CO_{12.5})$ | 15 |
| Switching layer | $Tb(Fe_{93}CO_7)$ | 10 |
| Initialization layer | $Tb(Fe_{20}Co_{80})$ | 40 |
| Second dipole layer | SiN | 30 |
| Heat conductive layer | AlTi | 40 |

| | TM/RE | Saturated magnetization [emu/cc] | Curie temperature [° C.] |
|---|---|---|---|
| First dipole layer | — | — | — |
| Memory layer | 1.1 | 150 | 180 |
| Intermediate layer | 1.8 | 250 | 230 |
| Recording layer | 1.3 | 0 | 270 |
| Switching layer | 1.8 | 170 | 190 |
| Initialization layer | 1.4 | 0 | >300 |
| Second dipole layer | — | — | — |
| Heat conductive layer | — | — | — |

Then, examples where the method of this invention was applied for the production of magneto-optical disks with above constitution will be described together with comparisons.

EXAMPLE 1

In this example, a substrate made of polycarbonate was set in place on a sputtering apparatus as shown in FIG. 2. On this substrate were formed the layers one after another as shown in FIG. 1 while the board 25 and substrate holder 26 were turned round.

To put it more specifically, at first, on the disc substrate 1 was formed a first dipole layer 2 with a thickness of 65 nm and composed of SiN ejected from a reactive RF sputter. Then, on the first dipole layer 2, were overlaid a memory layer 3 being 30 nm thick and composed of $Tb(Fe_{94}Co_6)$, an intermediate layer 4 being 10 nm thick and composed of GdFe, a recording layer 5 of 15 nm thick and composed of $(Gd_{25}Tb_{75})(Fe_{87.5}CO_{12.5})$, a switching layer 6 being 10 nm thick and composed of $Tb(Fe_{93}Co_7)$, and an initialization layer 7 being 40 nm thick and $Tb(Fe_{20}Co_{80})$ in succession in this order under the condition where DC magnetron sputters were used under a sputtering pressure of 7 mTorr without breaking vacuum in the chamber. Then, on the initialization layer 7 was overlaid a second dipole layer 8 being 30 nm thick and composed of SiN with another reactive RF sputter and, in addition, a heat conductive layer 9 being 40 nm thick and composed of AlTi with a further DC magnetron sputter. Later, the disc substrate 1 was removed from the sputtering apparatus, and a protective layer 10 composed of a Ultraviolet setting resin was overlaid upon the heat conductive layer 9. Through this operation, a magneto-optical disk with a constitution as described in FIG. 1 was produced.

During this operation, the compositions of memory layer 3, intermediate layer 4, recording layer 5, switching layer 6 and initialization layer 7 were appropriately adjusted by the opening and closure of shutters placed in front of individual shooters 21, 22, 23 and 24, and by the control of powers delivered to individual shooters 21, 22, 23 and 24. The opening and closure of shutters and the control of powers were adjusted appropriately according to given conditions of individual shooters, and thus, the shooters were adjusted of their shutters and powers one after another in a specific order. To put it specifically, in this example, Gd, Tb, Fe and $Fe_{20}Co_{80}$ shooters 22, 21, 23 and 24 were adjusted one after another in this order.

Further, in this example, the opening and closure of shutters of individual shooters were performed in the order as shown in Table 3. In Tables 4 and 5 listed below as well as in Table 3, the open circles represents the opening of a shutter, while the crosses represents the closure of a shutter. The first and second intermediate states represent the shutter conditions on completion of the memory layer 3 but prior to the formation of intermediate layer 4, while the third intermediate state represents the shutter condition on completion of the intermediate layer 4 but prior to the formation of recording layer 5.

TABLE 3

| | Shutter of Gd shooter | Shutter of Tb shooter | Shutter of Fe shooter | Shutter of FeCo shooter |
|---|---|---|---|---|
| Memory layer being formed | X | ○ | ○ | ○ |
| First intermediate state | ○ | ○ | ○ | ○ |
| Second intermediate state | ○ | X | ○ | ○ |
| Intermediate layer being formed | ○ | X | ○ | X |
| Third intermediate state | ○ | ○ | ○ | X |
| Recording layer being formed | ○ | ○ | ○ | ○ |
| Switching layer being formed | X | ○ | ○ | ○ |
| Initialization layer being formed | X | ○ | X | ○ |

As shown in Table 3, in this example, for a memory layer 3 to be formed, the shutter in front of Gd shooter 22 was closed, that of Tb shooter 21 was opened, that of Fe shooter 23 was opened, and that of $Fe_{20}Co_{80}$ shooter 24 was opened. On completion of the memory layer 3, firstly the shutter in front of Gd shooter was opened, followed by the closure of the shutters in front of Tb shooter 21 and then of $Fe_{20}Co_{80}$ shooter 24, to form an intermediate layer 4.

On completion of the intermediate layer 4, firstly the shutter in front of Tb shooter 21 was opened, which was followed by the opening of the shutter of $Fe_{20}Co_{80}$ shooter 24, to start the formation of a recording layer 5. Once the formation of the recording layer 5 was completed, the shutter in front of Gd shooter 22 was used to start the formation of a switching layer 6. Then, when the formation of the switching layer 6 was completed, the shutter in front of Fe shooter 23 was closed and the formation of an initialization layer 7 was started.

While the memory layer 3, intermediate layer 4, recording layer 5, switching layer 6 and initialization layer 7 were being formed, at least one of Tb and Gd shooters 21 and 22 to act as principal vaporizers of rare earth metals, and at least one of Fe and $Fe_{20}Co_{80}$ shooters 23 and 24 to act as principal vaporizers of transition metals were activated while the opening and closure of shutters being appropriately adjusted as described above, and particles therefrom kept impinging on the surface of substrate to form layers there. Accordingly, in this example, there is formed at each interface between magnetic layers a boundary layer composed of both transition metals and rare earth metals, even if the boundary layer is different in composition from the adjacent magnetic layers.

EXAMPLE 2

In this example, cathodes were exchanged between Tb and Gd shooters 21 and 22, and the opening and closure of shutters and the control of powers were adjusted in the order of Tb, Gd, Fe and $Fe_{20}Co_{80}$ shooters 21, 22, 23 and 24. The opening and closure of each shutter took place as shown in Table 4. Otherwise similarly processed as in Example 1, a magneto-optical disk was produced.

TABLE 4

|  | Shutter of Gd shooter | Shutter of Tb shooter | Shutter of Fe shooter | Shutter of FeCo shooter |
| --- | --- | --- | --- | --- |
| Memory layer being formed | ○ | X | ○ | ○ |
| First intermediate state | ○ | ○ | ○ | ○ |
| Second intermediate state | X | ○ | ○ | ○ |
| Intermediate layer being formed | X | ○ | ○ | X |
| Third intermediate state | ○ | ○ | ○ | X |
| Recording layer being formed | ○ | ○ | ○ | ○ |
| Switching layer being formed | ○ | X | ○ | ○ |
| Initialization layer being formed | ○ | X | X | ○ |

As shown in Table 4, in this example, for a memory layer 3 to be formed, the shutter in front of Tb shooter 21 was closed, that of Gd shooter 22 was open, that of Fe shooter 23 was opened, and that of $Fe_{20}Co_{80}$ shooter 24 was opened. On completion of the memory layer 3, firstly the shutter in front of Tb shooter 21 was opened, followed by the sequential closures of the shutter in front of the Gd shutter 21 and then the $Fe_{20}Co_{80}$ shooter 24, to start the formation of an intermediate layer 4.

On completion of the intermediate layer 4, firstly the shutter in front of Gb shooter 22 was opened, which was followed by the opening of the shutter of $Fe_{20}Co_{80}$ shooter 24, to start the formation of a recording layer 5. Once the formation of the recording layer 5 was completed, the shutter in front of Tb shooter 21 was closed, to start the formation of a switching layer 6. Then, when the formation of the switching layer 6 was completed, the shutter in front of Fe shooter 23 was closed and the formation of an initialization layer 7 was started.

While the memory layer 3, intermediate layer 4, recording layer 5, switching layer 6 and initialization layer 7 were being formed, at least one of Tb and Gd shooters 21 and 22 to act as principal vaporizers of rare earth metals, and at least one of Fe and $Fe_{20}Co_{80}$ shooters 23 and 24 to act as principal vaporizers of transition metals were activated while the opening and closure of shutters being appropriately adjusted as described above, and particles therefrom kept impinging on the surface of substrate to form layers there. Accordingly, in this example, there is formed at each interface between magnetic layers a boundary layer composed of both transition metals and rare earth metals, even if the boundary layer is different in composition from the adjacent magnetic layers.

Comparative Example

In this comparative example, a disc substrate was placed in the same sputtering apparatus, of which the shutters of individual shooters were opened and closed as shown in Table 5, and otherwise similarly processed as in Example 2 to produce a magneto-optical disk.

TABLE 5

|  | Shutter of Gd shooter | Shutter of Tb shooter | Shutter of Fe shooter | Shutter of FeCo shooter |
| --- | --- | --- | --- | --- |
| Memory layer being formed | ○ | X | ○ | ○ |
| First intermediate state | X | X | ○ | ○ |
| Second intermediate state | X | ○ | ○ | ○ |
| Intermediate layer being formed | X | ○ | ○ | X |
| Third intermediate state | ○ | ○ | ○ | X |
| Recording layer being formed | ○ | ○ | ○ | ○ |
| Switching layer being formed | ○ | X | ○ | ○ |
| Initialization layer being formed | ○ | X | X | ○ |

As shown in Table 5, in this comparative example, for a memory layer 3 to be formed, the shutter in front of Tb shooter 21 was opened, that of Gd shooter 22 was closed, that of Fe shooter 23 was opened, and that of $Fe_{20}Co_{80}$ shooter 24 was opened. On completion of the memory layer 3, firstly the shutter in front of Gd shooter 22 was closed, followed by the opening of the shutter of Tb shooter 21, then by the closure of the shutter in front of $Fe_{20}Co_{80}$ shooter 24, to start the formation of an intermediate layer 4.

On completion of the intermediate layer 4, firstly the shutter in front of Gd shooter 22 was opened, which was followed by the opening of the shutter of $Fe_{20}Co_{80}$ shooter 24, to start the formation of a recording layer 5. Once the formation of the recording layer 5 was completed, the shutter in front of Tb shooter 21 was closed, to start the formation of a switching layer 6. Then, when the formation of the switching layer 6 was completed, the shutter in front of Fe shooter 23 was closed and the formation of an initialization layer 7 was started.

When the opening and closure of shutters were adjusted as described above, during the formation of the first intermediate layer, Fe and $Fe_{20}Co_{80}$ shooters 23 and 24 to act as principal vaporizers of transition metals were activated, and only particles therefrom kept impinging on the surface of a substrate. Accordingly, in this comparative example, there was formed at the interface between the memory and intermediate layers 3 and 4, respectively, a boundary layer composed only of transition metals.

Evaluation of Examples and Comparative Examples

When signals are recorded on a magneto-optical disk which permits direct overwriting through light intensity modulation without requiring initial magnetization from outside, magnetic sectors corresponding with the signals are generated on the recording layer, and later the magnetic sectors are transcribed onto the memory layer. For a given magneto-optical disk to achieve faithful direct overwriting through light intensity modulation, it is necessary for the disc to have an even distribution of transcription ability over its whole surface, so that the magnetic sectors formed on the recording layer may be precisely and stably transcribed onto the memory layer.

In view of above, of the magneto-optical disks obtained in Examples and Comparative examples, their transcription ability was examined, and the disks were evaluated based on the results. The transcription ability was examined by the following method: a laser emitting apparatus whose aperture No. or NA was kept at 0.55 was so adjusted as to give a laser with a wavelength of 680 nm, the laser was applied onto the test disk where signals have been recorded, and the variation in transcription sensitivity over the disk surface was determined.

To put it more concretely, a pattern comprising a repetition of dashes of 2.6 $\mu$m long each was allowed to run at a speed of 9.4 m/sec and recorded onto the test magneto-optical disk under an optimal condition. Then, an external magnetic field of 300 Oe was applied in the recording direction, and maintained at the same level. Under this condition, a laser beam was continuously impinged upon the test magneto-optical disk while its power being slowly increased, to determine the laser power at which recorded signals began to be erased, or the erasion onset power. After, for a given test magneto-optical disk, recorded signals were erased with a laser beam having reached such an erasion onset power, the same disk was submitted to replay, the retrieved wave pattern was observed on CRT, and it was checked whether there were any variations in erasion sensitivity on the disk surface.

As a result of such evaluation test, the magneto-optical disks obtained in Examples 1 and 2 gave small variations in erasion sensitivity over the disk surface, which can be expressed as about 0.1 mW in terms of the power of laser beam. From this it is obvious that the magneto-optical disks obtained in Examples 1 and 2 had a practically even distribution of transcription ability over their whole surface.

By contrast, the magneto-optical disks obtained in Comparative examples gave big variations in erasion sensitivity on the surface, which can be expressed as about 0.5 mW in terms of the power of laser beam. From this it is obvious that the magneto-optical disks obtained in Comparative examples had an uneven distribution of transcription ability over their whole surface.

Further, for the test magneto-optical disks, their transcription stability was tested by measuring the intensity of the maximum applicable magnetic field.

The maximum applicable magnetic field is the maximum magnetic field that can be applied to a given test disk which is recording signals, without interfering with its recording activity. When a disk is engaged in direct overwriting through light intensity modulation, it must record signals in the presence of a magnetic field. Thus, such disk must be able to stably transcribe magnetic sectors formed in the recording layer onto the memory layer, in the face of a magnetic field. However, if the externally applied magnetic field is too large for the disk to manage, the transcription will not proceed properly. Thus, this externally applied magnetic filed should be kept below a certain level, if the disk is capable of properly transcribing signals in the recording layer onto the memory layer. The maximum applicable magnetic field is the maximum tolerable magnetic field for a test disk to transcribe properly signals in the recording layer onto the memory layer.

The maximum applicable magnetic field was determined for all the test disks, and it was found that magneto-optical disks obtained in Examples 1 and 2 tolerated the magnetic intensity of 600 Oe or more all over the surface, while the corresponding disks of Comparative examples gave the results as low as 300 Oe in certain parts of surface.

As seen from above, the magneto-optical disks obtained in Comparative examples had an uneven distribution of transcription ability over the surface, and maximum applicable magnetic fields vary depending on places of the surface. This is because, during the interval between the formation of the memory layer 3 and the recording layer 4, a boundary layer composed only of transition metals was formed on certain parts of the interface, and the magnetic barrier energies $\sigma w$ generated at those parts were reduced.

In other words, even if boundary layers are formed between adjacent magnetic layers, the variation of magnetic barrier energies $\sigma w$ generated at those boundary layers will be minimized if those boundary layers consist of both transition metals and rare earth metals as in Examples 1 and 2. As a result, the resulting recording medium will have less variations in the magnetic property over the surface of the laminated magnetic film.

Needless to say, the boundary layers composed of both transition metals and rare earth metals will suppress not only the variation of magnetic properties in a given magneto-optical disk, but also the variation of magnetic properties among a plurality of magneto-optical disks which are processed at the same time.

The above description has exclusively concerned with a magneto-optical disk with a laminated magnetic film composed of five layers, but the magnetic film having a five-layered structure alone does not form the substance of this invention. This invention can be widely applied for the production of magneto-optical disks with a laminated magnetic film of two or more magnetic layers.

To put it more concretely, take, as an example, a magneto-optical disk which has another magnetic layer called a replay layer added between the first dipole layer 2 and memory layer 3 to form a six layered structure, thereby to improve the properties necessary for the replay of signals. The method of this invention can be applied with profit for the production of such magneto-optical disks. The replay layer is intended to augment retrieved output, and is made of a material to give a big Kerr's angle of rotation such as Gd, Fe, Co, etc.

This invention can be also applied with profit for the production of a magneto-optical disk which allows direct overwriting through light intensity modulation in the presence of an initialization magnetic field externally applied. Such magneto-optical disk dispenses with the use of initialization layer and can have a laminated structure consisting only of about two magnetic layers.

Further, the magneto-optical recording media to which this invention can be applied with profit include not only the magneto-optical disks allowing direct overwriting through light intensity modulation, but also a wide variety of magneto-optical recording media with a laminated film composed of a plurality of magnetic layers made of alloys of rare earth metals-transition metals.

To put it more specifically, this invention can be also applied for the production of magneto-optical disks to which MSR technique has been applied.

MSR is a technique by which to retrieve data marks whose recorded interval is shorter than the size of beam spot by adding and using a specially devised recording layer on the magneto-optical disk. Generally, when a laser beam is impinged to form a spot on a disk, the front part of the spot has a higher temperature than does the rear part. Thus, when a magnetic layer which will mask magnetic actions in accordance with the temperature difference is added upon the magnetic layer which records signals, it becomes possible to magnetically mask a part of the beam spot. Accordingly, the existence of such magnetic layer will restrict the range where signals are picked up, and thus allow retrieval of smaller data marks than is possible with a common disk with no such magnetic layer. This is a brief summarization of MSR.

The magneto-optical disk based on MSR contains a magnetic layer which acts as a magnetic mask in accordance with temperature difference and another magnetic layer which actually records signals. For such disk to function effectively, it must have a magnetic boundary between the above two layers at room temperature. When this invention is applied for the production of such magneto-optical disks based on MSR, the variation in magnetic barrier energies ow distributed over the interface between the two magnetic layers one to act as a magnetic mask and the other to act as a signal recorder will be effectively suppressed.

What is claimed is:

1. A method for producing a magneto-optical recording medium, comprising the steps of:
   (a) providing a substrate as a workpiece;
   (b) providing first and second rare earth metal vaporizers respectively composed mainly of first and second rare earth metals;
   (c) providing first and second transition metal vaporizers respectively composed mainly of first and second transition metals;
   (d) exposing the workpiece to the second rare earth metal vaporizer and the first and second transition metal vaporizers to form a memory layer;
   (e) thereafter also exposing the workpiece to the first rare earth metal vaporizer while continuing to expose the workpiece to the second rare earth metal vaporizer and the first and second transition metal vaporizers;
   (f) thereafter shielding the workpiece from the second rare earth metal vaporizer while continuing to expose the workpiece to the first rare earth metal vaporizer and the first and second transition metal vaporizers;
   (g) thereafter shielding the workpiece from both the second rare earth vaporizer and the second transition metal vaporizer while continuing to expose the workpiece to the first rare earth metal vaporizer and the first transition metal vaporizer to form an intermediate layer over the memory layer;
   (h) thereafter re-exposing the workpiece to the second rare earth metal vaporizer while continuing to expose the workpiece to the first rare earth metal vaporizer and the first transition metal vaporizer but shielding the workpiece from the second transition metal vaporizer;
   (I) thereafter exposing the workpiece to the first and second rare earth metal vaporizers and the first and second transition metal vaporizers to form a recording layer;
   (j) thereafter shielding the workpiece from the first rare earth metal vaporizer while continuing to expose the workpiece to the second rare earth metal vaporizer and the first and second transition metal vaporizers to form a switching layer; and
   (k) thereafter shielding the workpiece from the first rare earth metal vaporizer and the first transition metal vaporizer while continuing to expose the workpiece to the second rare earth metal vaporizer and the second transition metal vaporizer to form an initialization layer.

2. The method of claim 1 wherein the first rare earth metal is Gd.

3. The method of claim 2 wherein the second rare earth metal is Tb.

4. The method of claim 1 wherein the first rare earth metal is Tb.

5. The method of claim 3 wherein the second rare earth metal is Gd.

6. The method of any of claims 1–5 wherein the first transition metal is Fe.

7. The method of any of claims 1–5 wherein the second transition metal is an FeCo alloy.

8. The method of claim 6 wherein the second transition metal is an FeCo alloy.

* * * * *